United States Patent
Sigtermans et al.

(10) Patent No.: US 11,204,901 B2
(45) Date of Patent: Dec. 21, 2021

(54) METHOD OF MATCHING RECORDS, METHOD OF SCHEDULING MAINTENANCE AND APPARATUS

(71) Applicant: ASML NETHERLANDS B.V., Veldhoven (NL)

(72) Inventors: David Evert Song Kook Sigtermans, Veldhoven (NL); Nicolaas Hendrik Frank Ploos Van Amstel, Eindhoven (NL); Marcel Theodorus Petrus Falise, Roermond (NL)

(73) Assignee: ASML Netherlands B.V., Veldhoven (NL)

( * ) Notice: Subject to any disclaimer, the term of this patent is extended or adjusted under 35 U.S.C. 154(b) by 353 days.

(21) Appl. No.: 16/091,285

(22) PCT Filed: Apr. 4, 2017

(86) PCT No.: PCT/EP2017/058026
§ 371 (c)(1),
(2) Date: Oct. 4, 2018

(87) PCT Pub. No.: WO2017/182269
PCT Pub. Date: Oct. 26, 2017

(65) Prior Publication Data
US 2019/0129891 A1    May 2, 2019

(30) Foreign Application Priority Data
Apr. 20, 2016    (EP) .................................... 16166218

(51) Int. Cl.
*G06F 16/215* (2019.01)
*G06F 16/23* (2019.01)
(Continued)

(52) U.S. Cl.
CPC ........ *G06F 16/215* (2019.01); *G03F 7/70508* (2013.01); *G03F 7/70525* (2013.01);
(Continued)

(58) Field of Classification Search
CPC ............... G06F 16/215; G06F 16/2379; G06F 11/0709; G06F 11/0751; G06F 11/0793;
(Continued)

(56) References Cited

U.S. PATENT DOCUMENTS 5,956,707 A * 9/1999 Chu .................. G06F 16/24573
707/759
6,564,214 B1 * 5/2003 Bhide ............... G06F 16/90344
(Continued)

FOREIGN PATENT DOCUMENTS

CN     101377622    3/2009
CN     100481070    4/2009
(Continued)

OTHER PUBLICATIONS

Elmagarmid, A.K., et al.: "Duplicate Record Detection: A Survey", IEEE Transactions on Knowledge and Data Engineering, vol. 19, No. 1, Jan. 2007.
(Continued)

*Primary Examiner* — Dennis Truong
(74) *Attorney, Agent, or Firm* — Pilsbury Winthrop Shaw Pittman LLP

(57) ABSTRACT

A method of matching records from a plurality of data sources having variation between them in matching quality of their data, the method including repeatedly matching and filtering records from the data sources to obtain matched records using successively less strict matching rules, the matching rules being defined based on the variation in the matching quality.

20 Claims, 3 Drawing Sheets

(51) Int. Cl.
| | |
|---|---|
| *G06F 16/832* | (2019.01) |
| *G06Q 10/06* | (2012.01) |
| *G06Q 10/00* | (2012.01) |
| *G05B 23/02* | (2006.01) |
| *G06Q 50/04* | (2012.01) |
| *G03F 7/20* | (2006.01) |
| *G03F 7/07* | (2006.01) |
| *G03F 7/00* | (2006.01) |
| *G06F 11/07* | (2006.01) |

(52) U.S. Cl.
CPC ..... *G03F 7/70533* (2013.01); *G05B 23/0283* (2013.01); *G06F 11/0709* (2013.01); *G06F 11/0751* (2013.01); *G06F 11/0793* (2013.01); *G06F 16/2379* (2019.01); *G06Q 10/06* (2013.01); *G06Q 10/067* (2013.01); *G06Q 10/20* (2013.01); *G06Q 50/04* (2013.01); *G06F 16/832* (2019.01); *Y02P 90/30* (2015.11)

(58) Field of Classification Search
CPC ...... G06Q 10/06; G06Q 10/20; G06Q 10/067; G06Q 50/04; G05B 23/0283; G03F 7/70525; G03F 7/70533; G03F 7/70508; G03F 7/00; Y02P 90/30
See application file for complete search history.

(56) References Cited

U.S. PATENT DOCUMENTS

| | | | |
|---|---|---|---|
| 6,879,866 B2 | 4/2005 | Tel et al. | |
| 7,051,044 B1* | 5/2006 | Fera | B61L 27/0094 |
| 2003/0216888 A1* | 11/2003 | Ridolfo | G05B 23/0283 |
| | | | 702/181 |
| 2004/0078171 A1* | 4/2004 | Wegerich | G05B 23/0254 |
| | | | 702/188 |
| 2004/0158562 A1 | 8/2004 | Caulfield et al. | |
| 2004/0225643 A1* | 11/2004 | Alpha | G06F 16/8373 |
| 2007/0299856 A1 | 12/2007 | McKeon et al. | |
| 2008/0021604 A1* | 1/2008 | Bouvier | G06Q 10/06 |
| | | | 701/29.5 |
| 2008/0189279 A1* | 8/2008 | Mayer | G06F 16/2468 |
| 2009/0037206 A1* | 2/2009 | Byrne | G06Q 10/06 |
| | | | 705/305 |
| 2010/0125513 A1 | 5/2010 | Chung et al. | |
| 2011/0002549 A1* | 1/2011 | Ohmori | G06K 9/6212 |
| | | | 382/218 |
| 2011/0137697 A1* | 6/2011 | Yedatore | G06F 11/0748 |
| | | | 705/7.13 |
| 2011/0219034 A1 | 9/2011 | Dekker et al. | |
| 2012/0008127 A1 | 1/2012 | Tel et al. | |
| 2013/0055145 A1* | 2/2013 | Antony | H04L 63/1408 |
| | | | 715/781 |
| 2014/0222793 A1 | 8/2014 | Sadkin et al. | |
| 2015/0161195 A1 | 6/2015 | Rieffanaugh, Jr. | |
| 2016/0041478 A1 | 2/2016 | Mulkens | |
| 2016/0133066 A1* | 5/2016 | Lavie | G07C 5/08 |
| | | | 701/31.4 |
| 2018/0267523 A1* | 9/2018 | Sigtermans | G05B 23/0243 |
| 2019/0129891 A1* | 5/2019 | Sigtermans | G06Q 10/20 |
| 2020/0342333 A1* | 10/2020 | Sigtermans | G03F 7/70508 |

FOREIGN PATENT DOCUMENTS

| | | | | |
|---|---|---|---|---|
| CN | 102782642 | | 11/2012 | |
| CN | 103545229 | | 1/2014 | |
| CN | 104742895 | | 7/2015 | |
| JP | 2011060088 A | * | 3/2011 | |
| JP | 2012208964 | | 10/2012 | |
| JP | 2013518357 | | 5/2013 | |
| WO | WO-2008144101 A2 | * | 11/2008 | ....... G06Q 10/06375 |

OTHER PUBLICATIONS

International Search Report and Written Opinion issued in corresponding PCT Patent Application No. PCT/EP2017/058026, dated May 11, 2017.

Japanese Office Action issued in corresponding Japanese Patent Application No. 2018-545954, dated Oct. 24, 2019.

Chinese Office Action issued in corresponding Chinese Patent Application No. 2017800242110, dated Aug. 4, 2021.

* cited by examiner

METHOD OF MATCHING RECORDS, METHOD OF SCHEDULING MAINTENANCE AND APPARATUS

CROSS-REFERENCE TO RELATED APPLICATIONS

This application is the U.S. national phase entry of PCT patent application no. PCT/EP2017/058026, which was filed on Apr. 4, 2017, which claims the benefit of priority of European patent application no. 16166218.4, which was filed on Apr. 20, 2016, and which is incorporated herein in its entirety by reference.

BACKGROUND

Field of the Invention

The present invention relates to methods of matching records, methods of scheduling, related computer program products and an apparatus associated with a lithographic process. The methods are useable, for example, in manufacturing systems, such as those using lithographic processes for manufacturing semiconductor devices.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

A lithographic apparatus is an example of an apparatus associated with a lithographic process. Other apparatus associated with a lithographic process include a track for coating a substrate with resist and a metrology tool for measuring Critical Dimensions (CD), layer-to-layer overlay, and focus of the lithographic apparatus.

A substrate processing system (an embodiment of which is sometimes known as a lithography cell) for performing a lithographic process comprises apparatus associated with the lithographic process. In a substrate processing system, typically comprising a lithographic apparatus and a track, maintenance must be performed on occasion to ensure that the machines in the substrate processing system continue to operate properly. For example, in a lithographic apparatus, calibrations that must be performed on a regular basis (e.g. once an hour, once a day) can be started automatically by a maintenance scheduler of the lithographic apparatus. Thus, in an implementation, each particular maintenance has a time interval associated with it (e.g. once a day).

To support the optimization of Operational Expenses (via for example a reliability centered maintenance approach) a computerized maintenance management system (CMMS) is considered a prerequisite. To determine the optimal maintenance strategy for a manufacturing system, a mix of business information (e.g. Operational Expense), performance information (e.g. reliability of components, duration of maintenance) and organizational information (e.g. man-to-machine ratio) is used. This list is not exhaustive. This CMMS contains all relevant business information, performance information and organizational information.

To improve proactive maintenance, computer models are used. Highly accurate maintenance information is used to calibrate such models. It is important to determine what happened, when it happened and what the business impact was. For testing purposes, although there are less strict accuracy demands, a deep investigation into the results is still performed. Creating a comprehensive overview of business aspects, performance aspects and organizational aspects of issues occurring in the field using a CMMS is an extremely labor intensive task. This is because data may not be centralized in a CMMS, but distributed over different data sources. Each specific type of information that is available in a certain database is optimized for a specific purpose: e.g. time writing (timesheet) information is optimized for billing customers and the exact start time of the work is less relevant.

Differences in data entry processes, data scope, and related to this, required data accuracy, make linking data from these different sources difficult and time consuming.

SUMMARY OF THE INVENTION

The inventors have devised methods of matching records and scheduling, which will allow integrating and qualifying data from different data sources, reflecting business, performance and organizational aspects of issues in an automated fashion. At the same time quality of the linked data can be indicated.

The invention in a first aspect provides a method of matching records from a plurality of data sources having variation between them in matching quality of their data, the method comprising repeatedly matching and filtering records from the data sources to obtain matched records using successively less strict matching rules, the matching rules being defined based on the variation in the matching quality.

The method of matching may further comprise the steps of:

(a) selecting a set of fields from the plurality of data sources;

(b) defining one or more distance measures between the fields; and (c) defining a set of matching rules with differing strictness based on the defined distance measures, and wherein repeatedly matching and filtering records from the data sources comprises the steps of:

(d) querying the data sources using the strictest of the set of matching rules and associating matched records thereby obtained with an indicator indicating the high matching quality; and (e) querying the data sources using a less strict rule of the set of matching rules and associating matched records thereby obtained with an indicator indicating a lower matching quality.

The invention in a second aspect provides a method of scheduling one or more maintenance actions in at least a part of a manufacturing system, the method comprising the steps:

matching records from a plurality of data sources having variation between them in matching quality of their data by repeatedly matching and filtering records from the data sources to obtain matched records using successively less strict matching rules, the matching rules being defined based on the variation in the matching quality; and scheduling one or more maintenance actions to be performed in a part of the manufacturing system using the matched records.

The method of scheduling may further comprise the steps of:

(a) selecting a set of fields from the plurality of data sources;

(b) defining one or more distance measures between the fields; and (c) defining a set of matching rules with differing strictness based on the defined distance measures, and wherein repeatedly matching and filtering records from the data sources comprises the steps of:

(d) querying the data sources using the strictest of the set of matching rules and associating matched records thereby obtained with an indicator indicating the high matching quality; and (e) querying the data sources using a less strict rule of the set of matching rules and associating matched records thereby obtained with an indicator indicating a lower matching quality.

The invention in a third aspect provides a computer program product comprising instructions for causing a programmable data processing apparatus to perform the method of matching according to the first aspect.

The invention in a fourth aspect provides a computer program product comprising instructions for causing a programmable data processing apparatus to perform the method of scheduling according to the second aspect.

The invention in a fifth aspect provides an apparatus associated with a lithographic process comprising:

a processing unit configured to match records comprising data from a plurality of data sources having variation between them in matching quality of their data by repeatedly matching and filtering records from the data sources to obtain matched records using successively less strict matching rules, the matching rules being defined based on the variation in the matching quality; and scheduling one or more maintenance actions to be performed in the apparatus using the matched records.

The processing unit may be further configured to:

(a) select a set of fields from the plurality of data sources;

(b) define one or more distance measures between the fields; and (c) define a set of matching rules with differing strictness based on the defined distance measures, and wherein the processing unit is further configured to repeatedly match and filter records from the data sources by:

(d) querying the data sources using the strictest of the set of matching rules and associating matched records thereby obtained with an indicator indicating the high matching quality; and (e) querying the data sources using a less strict rule of the set of matching rules and associating matched records thereby obtained with an indicator indicating a lower matching quality.

BRIEF DESCRIPTION OF THE DRAWINGS/FIGURES

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
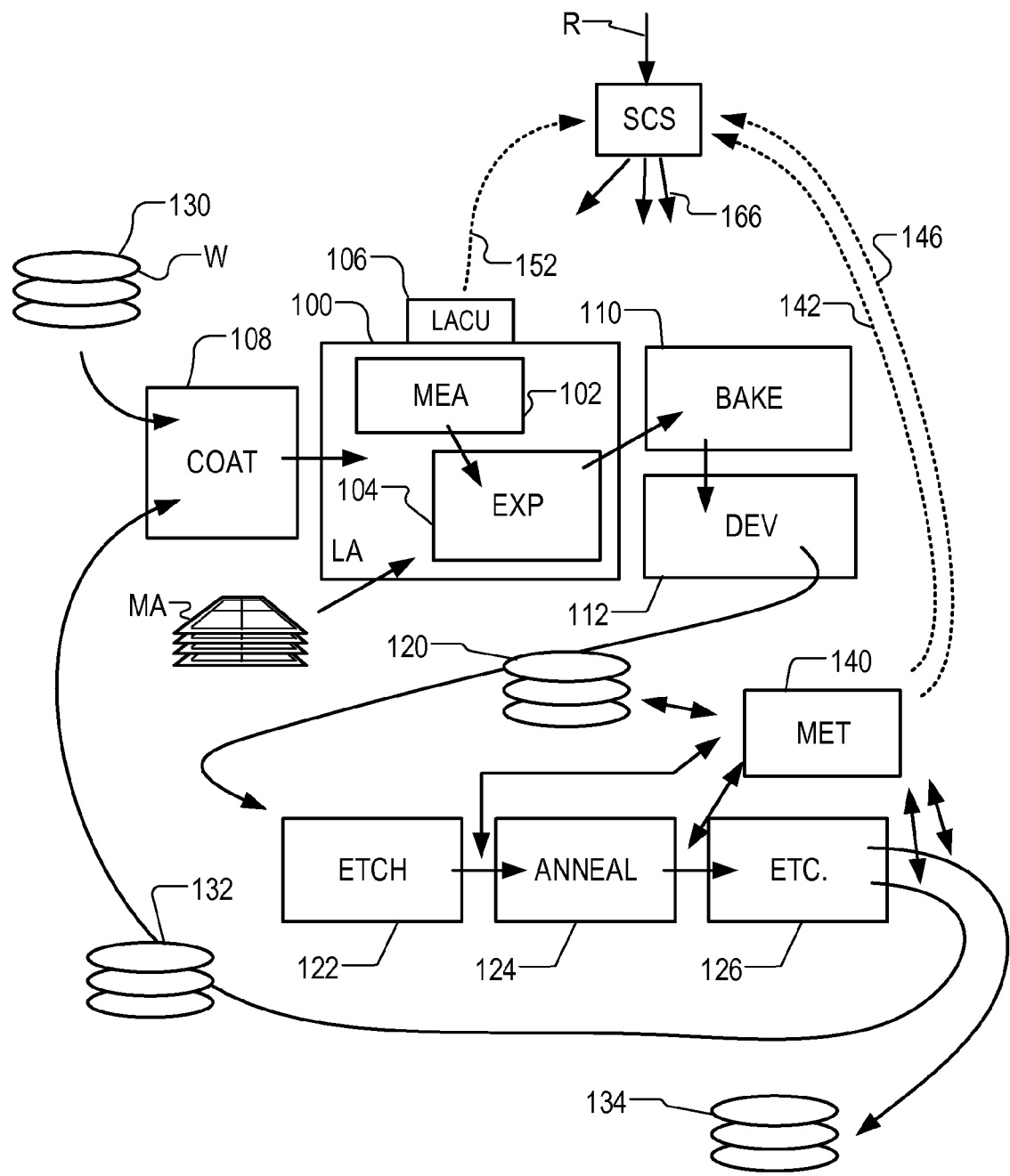
FIG. 1 depicts a lithographic apparatus together with other apparatuses associated with a lithographic process.

FIG. 1 depicts a lithographic apparatus together with other apparatuses associated with a lithographic process. Together they are part of a manufacturing system for semiconductor devices.

FIG. 1 at 100 shows a lithographic apparatus LA as part of an industrial facility implementing a high-volume, lithographic manufacturing process. In the present example, the manufacturing process is adapted for the manufacture of semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU controls all the movements and measurements of various actuators and sensors, causing the apparatus to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy.

The lithographic apparatus LA may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. When lithographic apparatus LA is of a so-called dual stage type which has two substrate tables, the exposure station and the measurement station may be distinct locations between which the substrate tables can be exchanged.

Within the production facility, apparatus 100 forms part of a "litho cell" or "litho cluster" that contains also a coating apparatus 108 for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the "track", are under the control of a track control unit which is itself controlled by a supervisory control system SCS, which also controls the lithographic apparatus via lithographic apparatus control unit LACU. Thus, the different apparatuses can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system (SCS) 138. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. As is also well known, the metrology results 142 from the apparatus 140 can be used to maintain accurate performance of the patterning operations in the litho cluster, by supervisory control system SCS and/or control unit LACU 106 making small adjustments over time, thereby minimizing the risk of products being made out-of-specification, and requiring re-work. Of course, metrology apparatus 140 and/or other metrology apparatuses (not shown) can be applied to measure properties of the processed substrates 132, 134, and incoming substrates 130.

Figure 2:
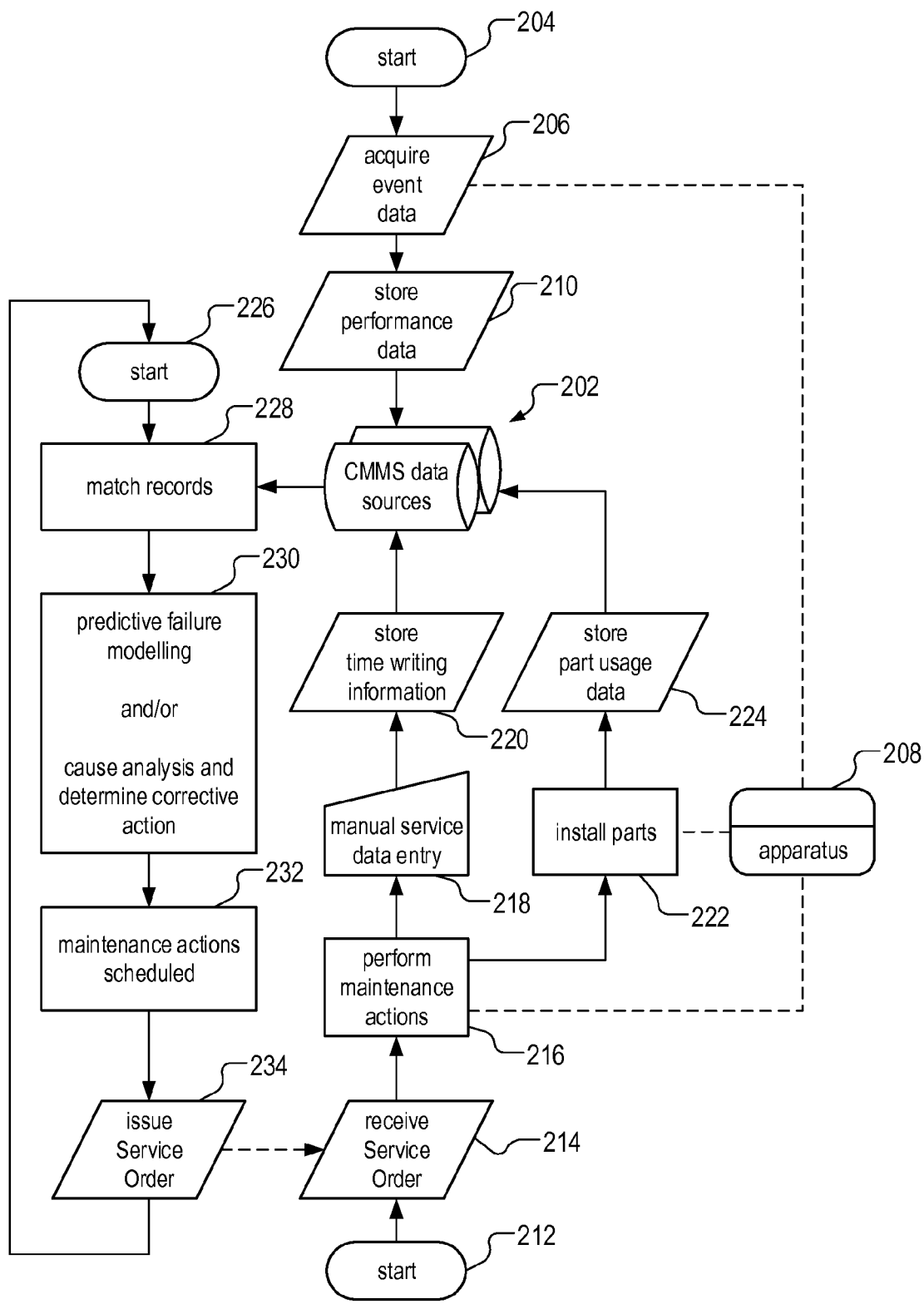
FIG. 2 is a flow diagram showing the use of a CMMS database for scheduling and control of maintenance actions.

FIG. 2 is a flow diagram showing the use of a CMMS database for scheduling and control of maintenance actions. This is an example application in which embodiments of the present invention may be implemented.

Data is not centralized in the CMMS, but distributed over different data sources 202 having differing data scope. For the different data sources 202, there are differences in data entry processes, data scope, and related to this, required data accuracy. This results in the data sources having variation between them in matching quality of their data.

Data is entered into the CMMS data sources by several different data entry processes. One such data entry process is data entry automatically from apparatus associated with a lithographic process. After the start of this process 204, event data is acquired 206 (shown by a dotted line) from the apparatus 208 associated with a lithographic process in a manufacturing system. Such event data is typically generated via software within millisecond accuracy, from sensors within the apparatus. Performance data is generated using the acquired event data. The performance data is stored 210 in a CMMS data source 202.

Two other CMMS data entry processes are shown in FIG. 2. Both start at 212 with the receipt 214 of a Service Order, which may be automatically generated by a scheduler to control the maintenance activity. Maintenance actions are performed 216 by an engineer (shown by a dotted line) in the apparatus 208. The engineer manually enters 218 service data. The service data may be time writing information that is entered onto a timesheet. The service data is stored 220 in a CMMS data source 202. Performing the maintenance action 216 may involve parts being installed 222 (shown by a dotted line) into the apparatus 208.

The CMMS data sources 202 may be used by a method of scheduling one or more maintenance actions in at least a part of the manufacturing system. FIG. 2 illustrates such a method starting at 226. Records are matched 228 from the data sources 202. This step is expanded on in FIG. 3, in accordance with an embodiment of the present invention. The step involves matching records from the data sources by repeatedly matching and filtering records from the data sources to obtain matched records using successively less strict matching rules. The matching rules are defined based on the variation in the matching quality between data of the data sources.

Scheduling of maintenance actions begins by using the matched records, at step 230 to run a predictive failure model and/or to perform cause analysis to determine one or more corrective actions. This results in maintenance actions being scheduled 232.

The method of scheduling may use a computer-implemented scheduler to match the records. The method further comprises controlling the performance of the one or more maintenance actions. In this example this is done by issuing 234 one or more Service Orders. As discussed above, these Service Orders are received 214 to initiate performance 216 of maintenance actions.

Figure 3:
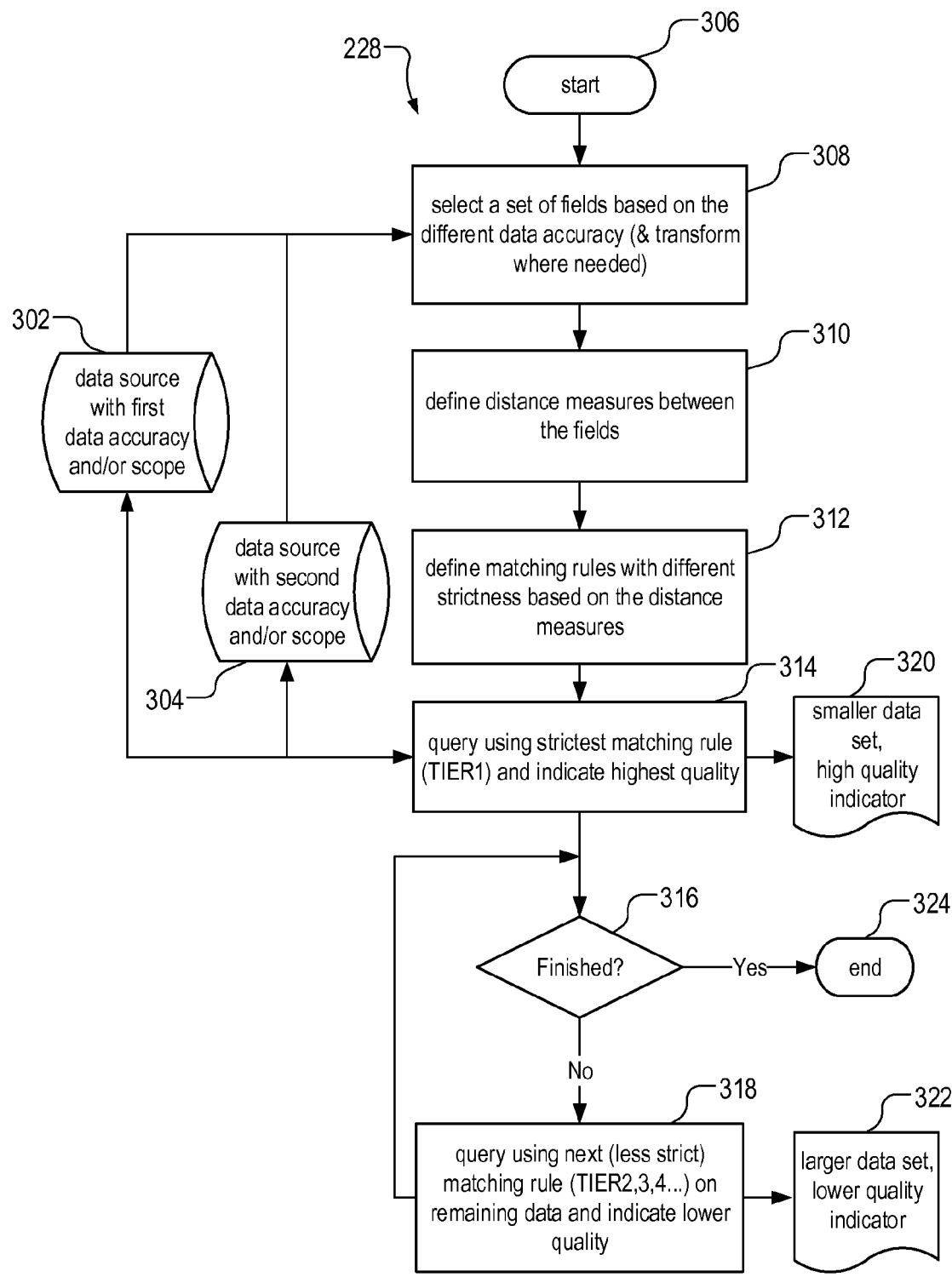
FIG. 3 is a flow diagram illustrating a method of matching according to an embodiment of the present invention.

FIG. 3 is a flow diagram illustrating a method of matching records according to an embodiment of the present invention. This method 228 may be used in the method of scheduling illustrated by steps 226 to 234 of FIG. 2.

A plurality of data sources 302 and 304 have variation between them in matching quality of their data. The variation between the data sources in matching quality may comprise a difference between the data sources in accuracy or scope of their data. In this example one data source 302 has a first data accuracy and/or scope and another data source 304 has a second, different, data accuracy and/or scope.

The method starts at step 306. Step 308 involves selecting a set of fields from the plurality of data sources 302, 304.

Step 310 involves defining one or more distance measures between the fields. The distance measures are related to the variation in the matching quality.

Step 312 involves defining a set of matching rules with differing strictness based on the defined distance measures. The matching rules are thus defined based on the variation in the matching quality.

The matching rules reflect the variation and differences in data entry processes and data scope. For example: certain event data is generated via software within millisecond accuracy, where other, related service data, is entered manually with potential delays of days. A progressively relaxed matching rule for "event occurrence date/time" could be an increasing difference in supposed "event occurrence date/time" between the different data sources.

The strictest matching rule may be an exact match i.e. specific data entries are identical, between data sources under consideration. In the case of strictest matching rule all matched data may be classified as belonging to the highest data quality tier (TIER1). The higher the data quality the lower the uncertainty about all aspects of the event. For this TIER1 data it is possible to qualify the business aspects (e.g. part cost, labor hours), machine aspects (downtime, root error or error pattern, downtime, number of related interrupts) and organizational aspects (time spent on certain activities during the down; differences in issue resolution depending on location etc.) with a high degree of accuracy.

The least strict matching rule is that no match can be found between data from different data sources. This means that for these issues only business aspect or only performance aspects or only organizational aspects are known. The lower the data quality, the higher the uncertainty about the event.

Matching rules may be "distance" measures between fields of different data sources. Between fields, distance measures can be defined.

For example, for date/times one could use the actual minimum of the difference between the date/times in a management information system.

For root errors (e.g. error codes associated with an apparatus failure) the distance measure may be defined as the inverse of the relative frequency of these root errors for certain groups of Service Orders (SO's) with common features like part usage, or failure description. Per part a list of all possible root errors that were ever recorded on that part can be created, plus their relative frequency. In case of an exact match between two data sets (i.e. they had the same root error) the "distance" can be defined as 0; otherwise the inverse of the relative frequency can be used.

Many other distance measures could be utilized for these two examples. Matching rules may be created by subject matter experts and reflect the idiosyncrasies of the data sources under consideration.

Examples of distance measures (where PMA=Preventive Maintenance Action data system, RER=Root Error Report→list of occurred root error codes, and SAP=software system from SAP SE) are:
1. Root error distance between machine generated data (source=PMA) and Service Order information with part used (manual, source is SAP).
a. If root error code in PMA=root error code in SAP:distance between the sources=0.
b. If root error code in PMA is not identical to the root error code in SAP, but "is in list" of the RER with parts, distance=1/(relative frequency)−1.
i. Per part, all RER's ever written by engineers on that specific part are counted. Based on this, the relative frequency of the root error code occurrence may be calculated.
2. Time distance between two time fields:
a. Distance (e.g. unit is arbitrary)=Difference in time between the two fields.
3. Number of parts distance: when a match can be found with certain SO's, the number of parts itself is used as a distance measure (the idea about distance: the larger the distance, the higher the uncertainty).
4. Source distance: each source can a priori be classified as being highly accurate or less accurate. Like the number of parts, this may be an absolute distance. Thus the sources may be ranked with respect to accuracy of the selected fields.

The matching rules are defined based on a distance measure between fields in different data sources. The matching rules may be defined based on a weighted sum of the distance measure. The distance measure may for example comprise:

A difference in time between fields in different data sources.

A difference between manually-generated data in a data source and machine-generated data in another data source.

A difference in number of equipment parts between fields in different data sources.

A difference in the inverse of the relative frequency of occurrence of error identifiers between fields in different data sources.

A difference in data-source accuracy between different data sources.

The method may also include transforming at least some of the data, before the matching steps, for example at step 308. Depending on the data type (date/time, text) specific transformation techniques can be used (e.g. for text certain text mining techniques may be employed).

Table 1 below shows an example set of matching rules.

TABLE 1

Example Matching rules

| Order of rule | Machine number | Date/Timestamp match | Error code match | Other match | Tier |
|---|---|---|---|---|---|
| 1 | Identical | | | Source = apparatus downtime report | TIER1 |
| 2 | Identical | SO timestamp matches with PMA interrupt timestamp (+/−30 minutes) | PMA error code identical to SO error code | 3 or fewer different parts on same SO | TIER1 |
| 3 | Identical | SO timestamp matches with PMA interrupt timestamp (+/−30 minutes) | PMA error code in list of "root errors per part", probability >=25% | 3 or fewer different parts on same SO | TIER2 |
| 4 | Identical | PMA interrupt timestamp in SO date (+/−3 days) | PMA error code identical to SO error code | 3 or fewer different parts on same SO | TIER2 |
| 5 | Identical | PMA interrupt timestamp in SO date (+/−3 days) | PMA error code identical to SO error code | More than 3 different parts on same SO | TIER3 |
| 6 | Identical | PMA interrupt timestamp in SO date (+/−3 days) | | Submodule identical | TIER4 |

Steps 314-318 involve matching records from the data sources 302, 304, by repeatedly matching and filtering records from the data sources to obtain matched records 320, 322 using successively less strict matching rules for unmatched records of a preceding match This involves querying 314 the data sources using the strictest of the set of matching rules and associating matched records thereby obtained 320 with an indicator indicating the high matching quality. It also involves querying 318 the data sources using a less strict rule of the set of matching rules and associating matched records thereby obtained with an indicator indicating a lower matching quality. The repeating finishes 316, 324 when all the rules are used, or earlier if desired.

Thus the matched records 320, 322 are associated with a matching quality indicator corresponding to the strictness of the matching rule used to obtain them.

The matched records 320, 322 may relate to a manufacturing-related event, such as an apparatus downtime event.

Thus, data is combined from different data sources using progressively relaxed "matching rules" for a preselected set of fields. For the data that does not match the strictest matching rules, i.e. the resulting match does not have the lowest associated uncertainty, progressively less strict matching rules are used. In other words an "algorithmic sieve" is used that both matches the available data sources and qualifies the match, for example by applying business specific knowledge.

The quality classification (TIER1 . . . TIERn) may be based on a weighted sum of the "distances". The definition of the quality classification may be the result of a decision process by subject matter experts and could vary from over time and per company.

In defining the rules it may be that they are collectively exhaustive i.e. all records from all sources are classified (and where possible linked). It has been found however that the matching rules do not need to be mutually exclusive. For example, a labor action can be related to several machine events that occurred on different times. Depending on the TIER definition these events could link to the same SO, but with different matching quality. Depending on the purpose of the analysis the required minimal matching quality will be different.

This "sieve" is expensive, in terms of computing time, as all records in the data sources are compared with each other (i.e. Cartesian product). A data partition method may be employed to reduce the calculation time. This partition method, performed prior to the matching steps, utilizes the property that based on some predefined fields the data can be partitioned in such a way that distance measures can be used to indicate what records of data source k needed to be matched with which records from data source 1. For example: the month in which the event occurred (data source 1) and the month in which the Service Orders were created (data source k) can be determined. Then only the records from the different data sources that belong to the same month (and year) are matched. The impact on the total calculation time depends on the number of partitions. In practice computing times may be reduced several orders of magnitude.

As described above, methods are provided that combine the different data sources while indicating the quality of the combination. This reduces the amount of work needed to match records. A measure of the usefulness of this approach is that without the methods described herein certain analysis takes a couple of weeks to perform. With the methods described herein the "manual" results can be reproduced and improved upon in a matter of hours.

Embodiments of the present invention reduce the need for a complete (hence expensive) fully-integrated CMMS solution. However, even when there is a complete CMMS solution available, the difference in scope between business, performance and organization will in general always lead to lower grade situational awareness. This is because matching is in most cases still very time consuming. Embodiments of the present invention reduce the manual labor needed to decrease inaccuracies. As has been demonstrated in several implementations, in some cases it can eliminate manual labor completely. This has been demonstrated in both predictive maintenance and identifying root causes (even with different rule sets).

Embodiments of the present invention allow that (re) design process and service portfolio improvement activities are more effective. This is done by providing a better integrated picture of business, performance and organizational aspects of machine issues in an automated (i.e. fast and repeatable) fashion. This enables better and faster decision making while at the same time reducing waste.

Embodiments of the invention may be implemented using a computer program containing one or more sequences of machine-readable instructions describing methods of matching records and/or scheduling maintenance actions as described above. This computer program may be executed for example within the control unit LACU of FIG. 1, or some other controller. There may also be provided a data storage medium (e.g. semiconductor memory, magnetic or optical disk) having such a computer program stored therein.

The present disclosure further comprises the following embodiments of the invention, presented as numbered clauses:

1. A method of matching records from a plurality of data sources having variation between them in matching quality of their data, the method comprising repeatedly matching and filtering records from the data sources to obtain matched records using successively less strict matching rules, the matching rules being defined based on the variation in the matching quality.

2. The method of matching according to clause 1, further comprising associating the matched records with a matching quality indicator corresponding to the strictness of the matching rule used to obtain them.

3. The method of matching according to clause 1 or clause 2, wherein the matched records relate to a manufacturing-related event.

4. The method of matching according to any preceding clause, wherein the variation between the data sources in matching quality comprises a difference between the data sources in accuracy of their data.

5. The method of matching according to any preceding clause, wherein the variation between the data sources in matching quality comprises a difference between the data sources in scope of their data.

6. The method of matching according to any preceding clause, wherein the matching rules are defined based on a distance measure between fields in different data sources.

7. The method of matching according to clause 6, wherein the distance measure comprises a difference in time between fields in different data sources.

8. The method of matching according to clause 6 or clause 7, wherein the distance measure comprises a difference between manually-generated data in a data source and machine-generated data in another data source.

9. The method of matching according to any of clauses 6 to 8, wherein the distance measure comprises a difference in number of equipment parts between fields in different data sources.

10. The method of matching according to any of clauses 6 to 9, wherein the distance measure comprises a difference in the inverse of the relative frequency of occurrence of error identifiers between fields in different data sources.

11. The method of matching according to any of clauses 6 to 10, wherein the distance measure comprises a difference in data-source accuracy between different data sources.

12. The method of matching according to any of clauses 6 to 11, wherein the matching rules are defined based on a weighted sum of the distance measure.

13. The method of matching according to any preceding clause, further comprising transforming or partitioning at least some of the data, preceding the matching.

14. The method of matching according to any preceding clause, further comprising the steps of:
(a) selecting a set of fields from the plurality of data sources;
(b) defining one or more distance measures between the fields; and
(c) defining a set of matching rules with differing strictness based on the defined distance measures,
and wherein repeatedly matching and filtering records from the data sources comprises the steps of:
(d) querying the data sources using the strictest of the set of matching rules and associating matched records thereby obtained with an indicator indicating the high matching quality; and
(e) querying the data sources using a less strict rule of the set of matching rules and associating matched records thereby obtained with an indicator indicating a lower matching quality.

15. A method of scheduling one or more maintenance actions in at least a part of a manufacturing system, the method comprising the steps:
matching records from a plurality of data sources having variation between them in matching quality of their data by repeatedly matching and filtering records from the data sources to obtain matched records using successively less strict matching rules, the matching rules being defined based on the variation in the matching quality; and scheduling one or more maintenance actions to be performed in a part of the manufacturing system using the matched records.

16. The method of scheduling according to clause 15, wherein scheduling one or more maintenance actions comprises running a predictive failure model using the matched records.

17. The method of scheduling according to clause 15, wherein scheduling one or more maintenance actions comprises performing cause analysis using the matched records to determine corrective action.

18. The method of scheduling according to any of clauses 15 to 17, wherein the records are matched using a scheduler and the method further comprises controlling the performance of the one or more maintenance actions in a part of the manufacturing system using the scheduler.

19. The method of scheduling according to any of clauses 15 to 18, further comprising associating the matched records with a matching quality indicator corresponding to the strictness of the matching rule used to obtain them.

20. The method of scheduling according to any of clauses 15 to 19, wherein the matched records relate to a manufacturing-related event.

21. The method of scheduling according to any of clauses 15 to 20, wherein the variation between the data sources in matching quality comprises a difference between the data sources in accuracy of their data.

22. The method of scheduling according to any of clauses 15 to 21, wherein the variation between the data sources in matching quality comprises a difference between the data sources in scope of their data.

23. The method of scheduling according to any of clauses 15 to 22, wherein the matching rules are defined based on a distance measure between fields in different data sources.

24. The method of scheduling according to clause 23, wherein the distance measure comprises a difference in time between fields in different data sources.

25. The method of scheduling according to clause 23 or clause 24, wherein the distance measure comprises a difference between manually-generated data in a data source and machine-generated data in another data source.

26. The method of scheduling according to any of clauses 23 to 25, wherein the distance measure comprises a difference in number of equipment parts between fields in different data sources.

27. The method of scheduling according to any of clauses 23 to 26, wherein the distance measure comprises a difference in the inverse of the relative frequency of occurrence of error identifiers between fields in different data sources.

28. The method of scheduling according to any of clauses 23 to 27, wherein the distance measure comprises a difference in data-source accuracy between different data sources.

29. The method of scheduling according to any of clauses 23 to 28, wherein the matching rules are defined based on a weighted sum of the distance measure.

30. The method of scheduling according to any of clauses 15 to 29, further comprising transforming or partitioning at least some of the data, preceding the matching.

31. The method of scheduling according to any of clauses 15 to 30, further comprising the steps of:

(a) selecting a set of fields from the plurality of data sources;

(b) defining one or more distance measures between the fields; and (c) defining a set of matching rules with differing strictness based on the defined distance measures, and wherein repeatedly matching and filtering records from the data sources comprises the steps of:

(d) querying the data sources using the strictest of the set of matching rules and associating matched records thereby obtained with an indicator indicating the high matching quality; and (e) querying the data sources using a less strict rule of the set of matching rules and associating matched records thereby obtained with an indicator indicating a lower matching quality.

32. A computer program product comprising instructions for causing a programmable data processing apparatus to perform the method of matching according to any of clauses 1 to 14.

33. A computer program product comprising instructions for causing a programmable data processing apparatus to perform the method of scheduling according to any of clauses 15 to 31.

34. An apparatus associated with a lithographic process comprising:

a processing unit configured to match records comprising data from a plurality of data sources having variation between them in matching quality of their data by repeatedly matching and filtering records from the data sources to obtain matched records using successively less strict matching rules, the matching rules being defined based on the variation in the matching quality; and scheduling one or more maintenance actions to be performed in the apparatus using the matched records.

35. The apparatus according to clause 34, further comprising associating the matched records with a matching quality indicator corresponding to the strictness of the matching rule used to obtain them.

36. The apparatus according to clause 34 or clause 35, wherein the matched records relate to a manufacturing-related event.

37. The apparatus according to any of clauses 34 to 36, wherein the variation between the data sources in matching quality comprises a difference between the data sources in accuracy of their data.

38. The apparatus according to any of clauses 34 to 37, wherein the variation between the data sources in matching quality comprises a difference between the data sources in scope of their data.

39. The apparatus according to any of clauses 34 to 38, wherein the matching rules are defined based on a distance measure between fields in different data sources.

40. The apparatus according to clause 39, wherein the distance measure comprises a difference in time between fields in different data sources.

41. The apparatus according to clause 39 or clause 40, wherein the distance measure comprises a difference between manually-generated data in a data source and machine-generated data in another data source.

42. The apparatus according to any of clauses 39 to 41, wherein the distance measure comprises a difference in number of equipment parts between fields in different data sources.

43. The apparatus according to any of clauses 39 to 42, wherein the distance measure comprises a difference in the inverse of the relative frequency of occurrence of error identifiers between fields in different data sources.

44. The apparatus according to any of clauses 39 to 43, wherein the distance measure comprises a difference in data-source accuracy between different data sources.

45. The apparatus according to any of clauses 39 to 44, wherein the matching rules are defined based on a weighted sum of the distance measure.

46. The apparatus according to any of clauses 34 to 45, further comprising transforming or partitioning at least some of the data, preceding the matching.

47. The apparatus according to any of clauses 34 to 46, wherein the processing unit is further configured to:

(a) select a set of fields from the plurality of data sources;

(b) define one or more distance measures between the fields; and (c) define a set of matching rules with differing strictness based on the defined distance measures, and wherein the processing unit is further configured to repeatedly match and filter records from the data sources by:

(d) querying the data sources using the strictest of the set of matching rules and associating matched records thereby obtained with an indicator indicating the high matching quality; and (e) querying the data sources using a less strict rule of the set of matching rules and associating matched records thereby obtained with an indicator indicating a lower matching quality.

Although specific reference may have been made above to the use of embodiments of the invention in the context of a lithographic process, it will be appreciated that embodiments of the invention may be used in other applications, for example manufacturing systems in general. Where the context allows, embodiments of the invention are not limited to apparatus associated with lithographic processing, or use with such apparatus.

The breadth and scope of the present invention should not be limited by any of the above-described exemplary embodiments, but should be defined only in accordance with the following claims and their equivalents.

The invention claimed is:

1. A method of matching records from a plurality of computer data sources having variation between them in matching quality of their data, the method comprising:

matching computer data records from the data sources to obtain matched records using a set of matching rules, the set of matching rules being successively less strict and the set of matching rules selected or created based on the variation in the matching quality, wherein the matching comprises:

(i) querying by a hardware computer processor system the data sources located in a memory by executing a strictest matching rule of the set of matching rules to perform an electronic data comparison in the hardware computer processor system to match a computer data record in the memory with another computer data record in the memory to obtain matched records;

(ii) querying by the hardware computer processor system the data sources located in the memory by executing a less strict rule of the set of matching rules to perform an electronic data comparison in the hardware computer processor system for unmatched records in the memory to obtain matched records; and (iii) repeating item (ii); and outputting an electronic or optical signal for scheduling one or more maintenance actions to be performed in a part of the manufacturing system using the matched records.

2. The method according to claim 1, further comprising associating the matched records with a matching quality indicator corresponding to the strictness of the matching rule used to obtain the matched records.

3. The method according to claim 1, wherein the variation between the data sources in matching quality comprises a difference between the data sources in accuracy of their data.

4. The method according to claim 1, wherein the matching rules are selected or created based on a distance measure, related to the variation in the matching quality, between fields in different data sources.

5. The method according to claim 4, wherein the distance measure comprises a difference in time between time fields in different data sources.

6. The method according to claim 4, wherein the distance measure comprises a difference in the inverse of the relative frequency of occurrence of error identifiers between fields in different data sources.

7. The method according to claim 1, further comprising transforming or partitioning at least some of the data, preceding the matching.

8. The method according to claim 1, further comprising:
selecting a set of fields from the plurality of data sources;
defining one or more distance measures, related to the variation in the matching quality, between the fields; and
defining a set of matching rules with differing strictness based on the defined distance measures.

9. A method of scheduling one or more maintenance actions in at least a part of a manufacturing system, the method comprising:

matching computer data records from a plurality of computer data sources having variation between them in matching quality of their data by matching computer data records from the data sources to obtain matched records using a set of matching rules, the set of matching rules being successively less strict and the set of matching rules selected or created based on the variation in the matching quality, wherein the matching comprises:

(i) querying by a hardware computer processor system the data sources located in a memory by executing a strictest matching rule of the set of matching rules to perform an electronic data comparison in the hardware computer processor system to match a computer data record in the memory with another computer data record in the memory to obtain matched records;

(ii) querying by the hardware computer processor system the data sources located in the memory by executing a less strict rule of the set of matching rules to perform an electronic data comparison in the hardware computer processor system for unmatched records in the memory to obtain matched records; and (iii) repeating item (ii); and scheduling one or more maintenance actions to be performed in a part of the manufacturing system using the matched records.

10. The method according to claim 9, wherein scheduling one or more maintenance actions comprises running a predictive failure model using the matched records.

11. The method according to claim 9, wherein the records are matched using a scheduler and the method further comprises controlling the performance of the one or more maintenance actions in a part of the manufacturing system using the scheduler.

12. An apparatus associated with a lithographic process, the apparatus comprising:
a processing unit configured to at least:
match computer data records from a plurality of computer data sources having variation between them in matching quality of their data by matching computer data records from the data sources to obtain matched records using a set of matching rules, the set of matching rules being successively less strict and the set of matching rules selected or created based on the variation in the matching quality, wherein the processing unit is configured to match computer data records by at least:
(i) performance of a query, by the processing unit, of the data sources located in a memory by execution of a strictest matching rule of the set of matching rules to perform an electronic data comparison in the processing unit to match a computer data record in the memory with another computer data record in the memory to obtain matched records;
(ii) performance of a query, by the processing unit, of the data sources located in the memory by executing of a less strict rule of the set of matching rules to perform an electronic data comparison in the processing unit for unmatched records in the memory to obtain matched records; and
(iii) performance of a repetition of item (ii); and
schedule one or more maintenance actions to be performed in the apparatus using the matched records.

13. The apparatus according to claim 12, wherein the matching rules are selected or created based on a distance measure, related to the variation in the matching quality, between fields in different data sources.

14. The apparatus according to claim 13, wherein the distance measure comprises a difference in time between time fields in different data sources.

15. The apparatus according to claim 13, wherein the distance measure comprises a difference in the inverse of the relative frequency of occurrence of error identifiers between fields in different data sources.

16. The apparatus according to claim 12, wherein the processing unit is further configured to associate the matched records with a matching quality indicator corresponding to the strictness of the matching rule used to obtain them.

17. The apparatus according to claim 12, wherein the matched records relate to a manufacturing-related event.

18. The apparatus according to claim 12, wherein the variation between the data sources in matching quality comprises a difference between the data sources in accuracy of their data.

19. The apparatus according to claim 12, wherein the processing unit is further configured to transform or partition at least some of the data, preceding the matching.

20. The apparatus according to claim 12, wherein the processing unit is further configured to:
select a set of fields from the plurality of data sources;
define one or more distance measures, related to the variation in the matching quality, between the fields; and
define a set of matching rules with differing strictness based on the defined distance measures.

* * * * *